US012796195B2

(12) United States Patent
Li et al.

(10) Patent No.: US 12,796,195 B2
(45) Date of Patent: Nov. 10, 2026

(54) ARRANGEMENT OF DATA AND SCAN LINES IN DISPLAY DEVICES

(71) Applicant: WUHAN CHINA STAR OPTOELECTRONICS TECHNOLOGY CO., LTD., Wuhan (CN)

(72) Inventors: Xiuyan Li, Wuhan (CN); Changwen Ma, Wuhan (CN); Xindong Mei, Wuhan (CN); Chao Wang, Wuhan (CN); Mingyue Li, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 454 days.

(21) Appl. No.: 18/263,532

(22) PCT Filed: May 29, 2023

(86) PCT No.: PCT/CN2023/096763
§ 371 (c)(1),
(2) Date: Jul. 29, 2023

(87) PCT Pub. No.: WO2024/239353
PCT Pub. Date: Nov. 28, 2024

(65) Prior Publication Data

US 2025/0098382 A1 Mar. 20, 2025

(30) Foreign Application Priority Data

May 19, 2023 (CN) ......................... 202310573512.6

(51) Int. Cl.

| | |
|---|---|
| ***H10H 29/32*** | (2025.01) |
| ***H10H 20/857*** | (2025.01) |
| ***H10W 90/00*** | (2026.01) |

(52) U.S. Cl.
CPC .......... *H10H 20/857* (2025.01); *H10W 90/00* (2026.01)

(58) Field of Classification Search
CPC ........ H01L 25/167; H10H 29/32; G09G 3/32; G09G 3/2074; G09G 2310/0202; G02F 1/136286
See application file for complete search history.

(56) References Cited

U.S. PATENT DOCUMENTS

2006/0197882 A1 9/2006 Oh et al.
2013/0176318 A1* 7/2013 Dunn ....................... G09G 3/36 345/92

(Continued)

FOREIGN PATENT DOCUMENTS

CN 103235431 A 8/2013
CN 106681067 A 5/2017

(Continued)

OTHER PUBLICATIONS

International Search Report in International application No. PCT/CN2023/096763, mailed on Feb. 7, 2024.

(Continued)

*Primary Examiner* — Ismail A Muse
(74) *Attorney, Agent, or Firm* — PV IP PC; Christopher S. Ruprecht; Wei Te Chung

(57) ABSTRACT

The present application discloses a display device. The display device includes a first scan line, a second scan line, a first data line, a second data line, a first sub-pixel, and a second sub-pixel. The first sub-pixel includes a first thin film transistor, and the second sub-pixel includes a second thin film transistor. The first thin film transistor is connected to the first scan line and the first data line. The second thin film transistor is connected to the second scan line and the second (Continued)

data line. The first thin film transistor and the second thin film transistor are alternatively arranged.

20 Claims, 5 Drawing Sheets

(56) References Cited

U.S. PATENT DOCUMENTS

| | | | | |
|---|---|---|---|---|
| 2015/0293394 | A1* | 10/2015 | Chung | G02F 1/133784 349/110 |
| 2017/0220149 | A1* | 8/2017 | Jin | G02F 1/13338 |
| 2017/0343868 | A1* | 11/2017 | Kim | H10D 86/411 |
| 2020/0251072 | A1* | 8/2020 | Chen | G09G 5/18 |
| 2020/0379294 | A1 | 12/2020 | Shin et al. | |
| 2021/0335987 | A1 | 10/2021 | Kim et al. | |
| 2022/0101765 | A1 | 3/2022 | Lee | |
| 2022/0208093 | A1 | 6/2022 | Keum et al. | |

FOREIGN PATENT DOCUMENTS

| | | | |
|---|---|---|---|
| CN | 106959563 | A | 7/2017 |
| CN | 107065366 | A | 8/2017 |
| CN | 109521616 | A | 3/2019 |
| CN | 110554541 | A | 12/2019 |
| CN | 111999931 | A | 11/2020 |
| CN | 213781542 | U | 7/2021 |
| CN | 113406832 | A | 9/2021 |
| JP | 2001264803 | A | 9/2001 |
| JP | 2004046092 | A | 2/2004 |
| JP | 2010272845 | A | 12/2010 |
| JP | 2014146021 | A | 8/2014 |
| JP | 2019211568 | A | 12/2019 |
| JP | 2020504324 | A | 2/2020 |
| JP | 2021021945 | A | 2/2021 |
| KR | 20060109213 | A | 10/2006 |
| WO | 2016098317 | A1 | 6/2016 |

OTHER PUBLICATIONS

Written Opinion of the International Search Authority in International application No. PCT/CN2023/096763, mailed on Feb. 7, 2024.

Japanese Office Action issued in corresponding Japanese Patent Application No. 特願2023-542621 dated Sep. 2, 2025, pp. 1-9.

Chinese Office Action issued in corresponding Chinese Patent Application No. 202310573512.6 dated May 13, 2026, pp. 1-8.

Japanese Decision of Refusal issued in corresponding Japanese Patent Application No. 特願2023-542621 dated Mar. 3, 2026, pp. 1-4.

* cited by examiner

ARRANGEMENT OF DATA AND SCAN LINES IN DISPLAY DEVICES

TECHNICAL FIELD

The present application relates to a field of display technologies, and more particularly, to a display device.

BACKGROUND

Virtual Reality (VR) realizes simulation of visual sense of a user by simulation technology, computer graphics man-machine interface technology, multimedia technology, sensor technology, network technology, and the like, to provide a personal experience with the user. With the development of VR display technology, the higher and higher resolution of VR display devices is demanded. However, existing VR display devices are limited by hardware and software, and cannot improve the resolution of VR display devices.

SUMMARY

The present application provides a display device, which can improve resolution and achieve a high-resolution display effect.

In an aspect, an embodiment of the present application provides a display device including a plurality of scan lines, a plurality of data lines, and a plurality of sub-pixels. The plurality of scan lines includes a first scan line and a second scan line, the first scan line and the second scan line are spaced apart in a first direction. The plurality of data lines includes a first data line and a second data line, the first data line and the second data line are spaced apart in a second direction. The plurality of sub-pixels includes a first sub-pixel and a second sub-pixel, the first sub-pixel includes a first thin film transistor, the second sub-pixel includes a second thin film transistor, the first thin film transistor is connected to the first scan line and the first data line, the second thin film transistor is connected to the second scan line and the second data line, and the first thin film transistor and the second thin film transistor are alternatively arranged.

In some embodiments of the present application, an extension direction of a channel of the first thin film transistor is mirror-symmetrical in the second direction with an extension direction of a channel of the second thin film transistor adjacent to the first thin film transistor.

In some embodiments of the present application, the first data line and the second data line are alternately arranged in the second direction, and the first scan line and the second scan line are alternately arranged in the first direction.

In some embodiments of the present application, the plurality of sub-pixels includes a plurality of sub-pixel groups, the plurality of sub-pixel groups includes a first sub-pixel group and a second sub-pixel group, each of the first sub-pixel group and the second sub-pixel group includes a first sub-pixel column and a second sub-pixel column, the first sub-pixel group includes a plurality of the first sub-pixels spaced apart along the first direction, and the second sub-pixel column includes a plurality of the second sub-pixels spaced apart along the first direction; wherein the first sub-pixel group and the second sub-pixel group are alternately arranged in the second direction, and the first sub-pixel group and the second sub-pixel group are mirror-symmetric in the second direction.

In some embodiments of the present application, the display panel includes a plurality of light-shielding portions, the light-shielding portions are provided in one-to-one correspondence with the sub-pixel groups.

In some embodiments of the present application, the display panel includes a substrate and a spacer, an orthographic projection of the light-shielding portion on the substrate covers an orthographic projection of the spacer on the substrate, the spacer is disposed between two adjacent first sub-pixels in the second direction; and/or the spacer is disposed between two adjacent second sub-pixels in the second direction.

In some embodiments of the present application, an orthographic projection of the spacer on the substrate at least partially overlaps an orthographic projection of the second scan line on the substrate.

In some embodiments of the present application, the display device includes a substrate, the first data line is disposed on the substrate, the second data line is disposed on a side of the first data line away from the substrate, and an orthographic projection of the first data line on the substrate at least partially overlaps an orthographic projection of the second data line on the substrate.

In some embodiments of the present application, the display device has a display area, and a non-display area disposed around the display area; the display area is provided with the sub-pixels; the non-display area is provided with a first driving module, a second driving module, a multi-stage cascaded first gate driving unit and a multi-stage cascaded second gate driving unit; the first driving module is connected to the first gate driving unit; the second driving module is connected to the second gate driving unit; and the first gate driving unit and the second gate driving unit are respectively disposed on opposite sides of the non-display area in the second direction; wherein the first gate driving unit is connected to at least two of the scan lines, and the second gate driving unit is connected to at least two of the scan lines.

In some embodiments of the present application, the scan line includes a first sub-scan line and a second sub-scan line, the first sub-scan line and the second sub-scan line are spaced apart along the second direction, the first sub-scan line is connected to the first gate driving unit, and the second sub-scan line is connected to the second gate driving unit.

In some embodiments of the present application, the first gate driving unit is connected to two adjacent first sub-scan lines, and the second gate driving unit is connected to two adjacent second sub-scan lines.

In some embodiments of the present application, the first gate driving unit is connected to the first scan line, and the second gate driving unit is connected to the second scan line.

In some embodiments of the present application, the first gate driving unit is connected to two adjacent first scan lines; and/or the second gate driving unit is connected to two adjacent second scan lines.

In some embodiments of the present application, the non-display area is further provided with a source driving chip, the source driving chip includes a plurality of first source driving chips and a plurality of second source driving chips, the first driving module is connected to the first source driving chips, the second moving module is connected to the second source driving chips, and the source driving chip is connected to the data lines.

In some embodiments of the present application, the first source driving chips, the second source driving chips, the first driving module, and the second driving module are disposed on a same side of the non-display area in the first direction.

In some embodiments of the present application, the plurality of first source driving chips are respectively connected to a plurality of the first data lines, and the plurality of second source driving chips are respectively connected to a plurality of the second data lines.

In some embodiments of the present application, the first gate driving unit is connected to two adjacent first scan lines; and/or the second gate driving unit is connected to two adjacent second scan lines.

In some embodiments of the present application, the first driving module and the second driving module are disposed on opposite sides of the non-display area in the first direction.

In some embodiments of the present application, the sub-pixel further includes an opening area, a cross-section of the opening area has a "P" shape in a horizontal direction.

In some embodiments of the present application, the first sub-pixel includes a first opening area, the second sub-pixel includes a second opening area, two adjacent second opening areas in the second direction are mirror-symmetrical in the first direction, and two adjacent first opening areas in the second direction are mirror-symmetrical in the first direction.

Beneficial Effect

The display device provided in the present application includes a plurality of scan lines, a plurality of data lines, and a plurality of sub-pixels, wherein the plurality of scan lines includes a first scan line and a second scan line, and the first scan line and the second scan line are spaced apart in a first direction; the plurality of data lines includes a first data line and a second data line, the first data line and the second data line are spaced apart in a second direction; the plurality of sub-pixels includes a first sub-pixel and a second sub-pixel, the first sub-pixel includes a first thin film transistor, the second sub-pixel includes a second thin film transistor, the first thin film transistor is connected to the first scan line and the first data line, the second thin film transistor is connected to the second scan line and the second data line; and the first thin film transistor and the second thin film transistor are alternatively arranged. According to the display device provided in the present invention, by providing the first data line and the second data line, the first sub-pixel is connected to the first data line, and the second sub-pixel is connected to the second data line. That is, in a case that the load of the pixel driving circuit is not increased, the sub-pixels of an odd column and the sub-pixels of an even column are respectively provided with data signals by different data lines, thereby effectively improving the resolution of the display device and realizing a high-resolution display effect.

DETAILED DESCRIPTION OF THE EMBODIMENTS

Figure 1:
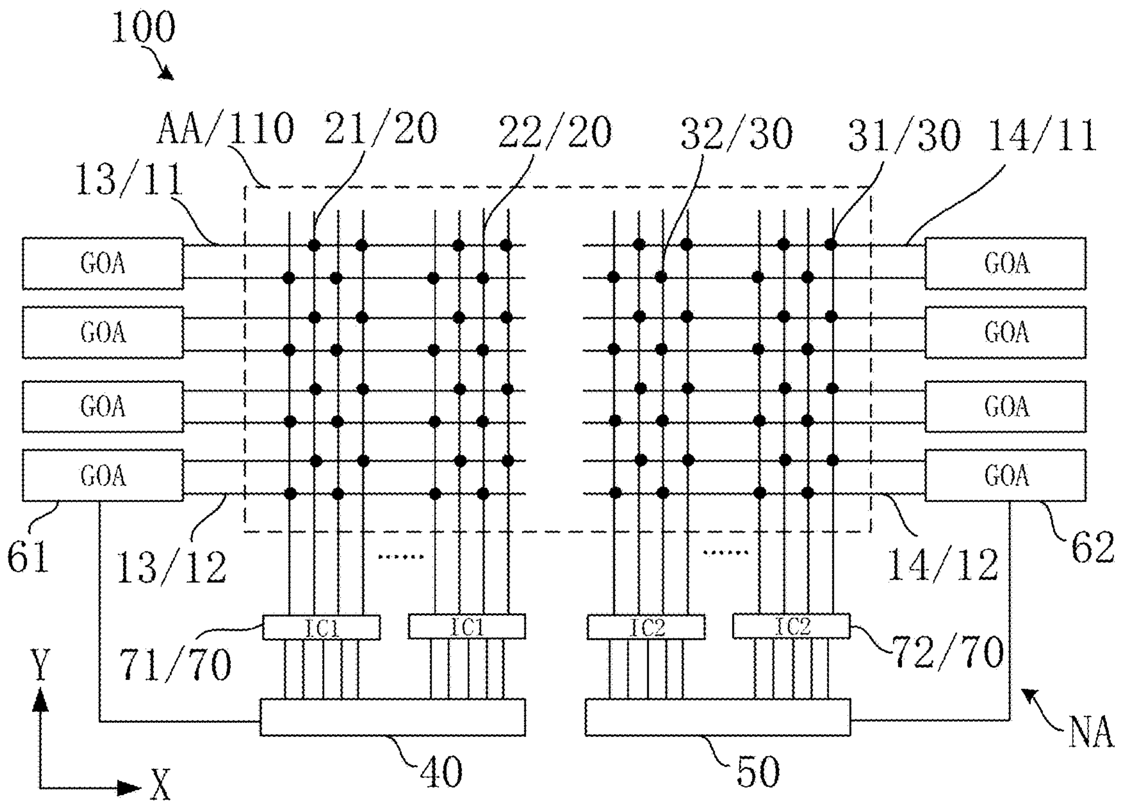
FIG. 1 is a schematic diagram of a first configuration of a display device according to an embodiment of the present application.

As shown in FIG. 1, an embodiment of the present application provides a display device 100 including a display panel 110. The display panel 110 includes a plurality of scan lines 10, a plurality of data lines 20, and a plurality of sub-pixels 30. The plurality of scan lines 10 includes a first scan line 11 and a second scan line 12, the first scan line 11 and the second scan line 12 are spaced apart in a first direction Y. The plurality of data lines 20 includes a first data line 21 and a second data line 22, the first data line 21 and the second data line 22 are spaced apart in a second direction X. The plurality of sub-pixels 30 includes a first sub-pixel 31 and a second sub-pixel 32, the first sub-pixel 31 includes a first thin film transistor 311, and the second sub-pixel 32 includes a second thin film transistor 321. The first thin film transistor 311 is connected to the first scan line 11 and the first data line 21, and the second thin film transistor 321 is connected to the second scan line 12 and the second data line 22. The first thin film transistor 311 and the second thin film transistor 321 are alternatively arranged.

According to the display device provided in the present application, by arranging the first data line 21 and the second data line 22, the first thin film transistor 311 is connected to the first data line 21, and the second thin film transistor 321 is connected to the second data line 22. That is, in a case that the load of the pixel driving circuit is not increased, the sub-pixels 30 of the odd columns and the sub-pixels 30 of the even columns are respectively provided with data signals by different data lines 20. As such, the resolution of the display device is effectively improved, and a high-resolution display effect is provided.

In an embodiment of the present application, the first data line 21 and the second data line 22 are alternately arranged in the second direction X, and the first scan line 11 and the second scan line 12 are alternately arranged in the first direction Y. Specifically, the first direction Y is an extension direction of the data line 20, and the second direction X is an extension direction of the scan line 10.

In an embodiment of the present application, one first sub-pixel 31 and two second sub-pixels 32 define a pixel unit, or one second sub-pixel 32 and two first sub-pixels 31 define a pixel unit. That is, each pixel unit is driven by two data lines 20 (the first data line 21 and the second data line 22).

In an embodiment of the present application, the display device 100 has a display area AA, and a non-display area NA disposed around the display area AA. The display area AA is provided with sub-pixels 30, scan lines 10 and data lines 20, wherein the scan lines 10 and the data lines 20 are connected to the sub-pixels 30. The non-display area NA is provided with a first driving module 40, a second driving module 50, a multi-stage cascaded first gate driving unit 61, and a multi-stage cascaded second gate driving unit 62. The first driving module 40 is connected to the first gate driving unit 61, the second driving module 50 is connected to the second gate driving unit 62, and the first gate driving unit 61 and the second gate driving unit 62 are respectively located on opposite sides of the non-display area NA in the second direction X. The first gate driving unit 61 is connected to at least two scan lines 10, and the second gate driving unit 62 is connected to at least two scan lines 10.

In an embodiment of the present application, the scan line 10 includes a first sub-scan line 13 and a second sub-scan line 14, the first sub-scan line 13 and the second sub-scan line 14 are spaced apart along the second direction X. The first sub-scan line 13 is connected to the first gate driving unit 61, and the second sub-scan line 14 is connected to the second gate driving unit 62. Specifically, the first scan line 11 and the second scan line 12 each include a first sub-scan line 13 and a second sub-scan line 14. The number of sub-pixels 30 connected to the first sub-scan line 13 is equal to the number of sub-pixels 30 connected to the second sub-scan line 14, so that the loads of the first gate driving unit 61 and the second gate driving unit 62 are the same, thereby avoiding uneven brightness of the display device due to load difference.

Further, the length of the first sub-scan line 13 is equal to the length of the second sub-scan line 14, and the sub-pixels 30 connected to the first sub-scan line 13 and the sub-pixels 30 connected to the second sub-scan line 14 are symmetrically arranged relative to the central axis of the display area AA, thereby further ensuring brightness uniformity of the display device.

In an embodiment of the present application, the first gate driving unit 61 is connected to two adjacent first sub-scan lines 13, and the second gate driving unit 62 is connected to two adjacent second sub-scan lines 14. Specifically, the first gate driving unit 61 is connected to the first sub-scan line 13 of the first scan line 11 and the first sub-scan line 13 of the adjacent second scan line 12, respectively. Correspondingly, the second gate driving unit 62 is connected to the second sub-scan line 14 of the first scan line 11 and the second sub-scan line 14 of the adjacent second scan line 12, respectively. As such, the same pixel unit is input with the scan signal by one first gate driving unit 61 or one second gate driving unit 62, thereby improving the charging time of the sub-pixel 30 and enhancing the cascading stability of the gate driving circuit.

In an embodiment of the present application, the non-display area NA is further provided with a source driving chip 70 including a plurality of first source driving chips 71 and a plurality of second source driving chips 72. The first driving module 40 is connected to the first source driving chips 71, and the second driving module 50 is connected to the second source driving chips 72, and the source driving chip 70 is connected to the data line 20.

Specifically, the plurality of first source driving chips 71 and the plurality of second source driving chips 72 are spaced in the second direction X. The first driving module 40 is disposed corresponding to the first source driving chip 71 in the first direction Y, and the second driving module 50 is disposed corresponding to the second source driving chip 72 in the first direction Y. The first source driving chips 71/and the second source driving chips 72 are connected to the plurality of data lines 20, respectively. As such, three or more sub-pixels 30 in the same pixel unit are input with the scan signal by the same first gate driving unit 61/and the second gate driving unit 62, and input with the data signal by the same first source driving chip 71/and the second source driving chip 72, thereby ensuring the identity of the scan signal and the data signal, and avoiding display abnormality caused by signal input difference.

In an embodiment of the present application, the first source driving chip 71, the second source driving chip 72, the first driving module 40, and the second driving module 50 are located on the same side of the non-display area NA in the first direction Y.

In an embodiment of the present application, the display device further includes a light-emitting substrate 101 including a plurality of light-emitting areas, and a plurality of light-emitting devices are provided in the light-emitting area. The light-emitting device includes a micro light-emitting diode or a sub-millimeter light-emitting diode. The switch or luminance of the light-emitting device in each light-emitting area is related to the gray scale of the corresponding position in the image displayed by the display device. In a time period of one frame of the display picture, the light-emitting areas emit lights in sequence. The light-emitting areas emitting lights synchronizes with the display data writing. The light-emitting areas start to emit lights at a time delayed by half a frame than a writing time of the display data. The lights emitted by the light-emitting device is diffused in one to three adjacent light-emitting areas. At the same time, the areas emitted the lights constitute 5% to 25% of all the light-emitting areas.

Figure 2:
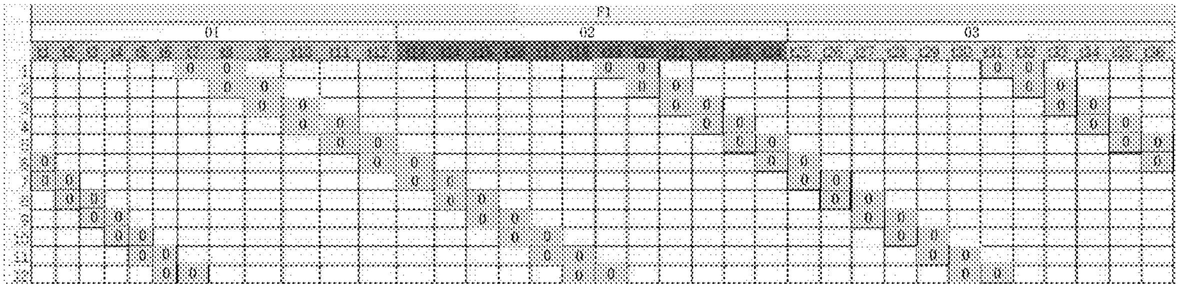
FIG. 2 is a timing chart of a backlight driving circuit of a display device according to an embodiment of the present application.

In an embodiment of the present application, the display device further includes an image processing module. The image processing module is configured to process an image signal input from the host terminal and output image data to the backlight driving circuit, and the image data includes a backlight driving signal and a synchronization signal, wherein the synchronization signal is configured to synchronize the backlight with the display image. As shown in FIG. 2, one frame of the display image includes three sub-frames, and the image processing module outputs a backlight driving signal and a synchronization signal to the backlight driving circuit corresponding to the three sub-frames at the same time. Specifically, the sub-frame image and the backlight data newly generated by the image processing module are respectively stored in corresponding buffers. The first driving module and the second driving module synchronize the displayed images under the control of the synchronization signal output by the image processing module.

In an embodiment of the present application, the driving module may be one, and may control the first source driving chip and the corresponding second source driving chip to synchronously output the data signal under the control of the synchronization signal output by the image processing module, and may control the first gate driving unit and the corresponding second gate driving unit to synchronously output the scan signal, so as to ensure that the backlight and the display panel are driven based on a preset time sequence, and at the same time, to ensure that a plurality of sub-frame pictures are synchronously displayed to avoid picture abnormalities caused by non-synchronization of the image data.

Figure 3:
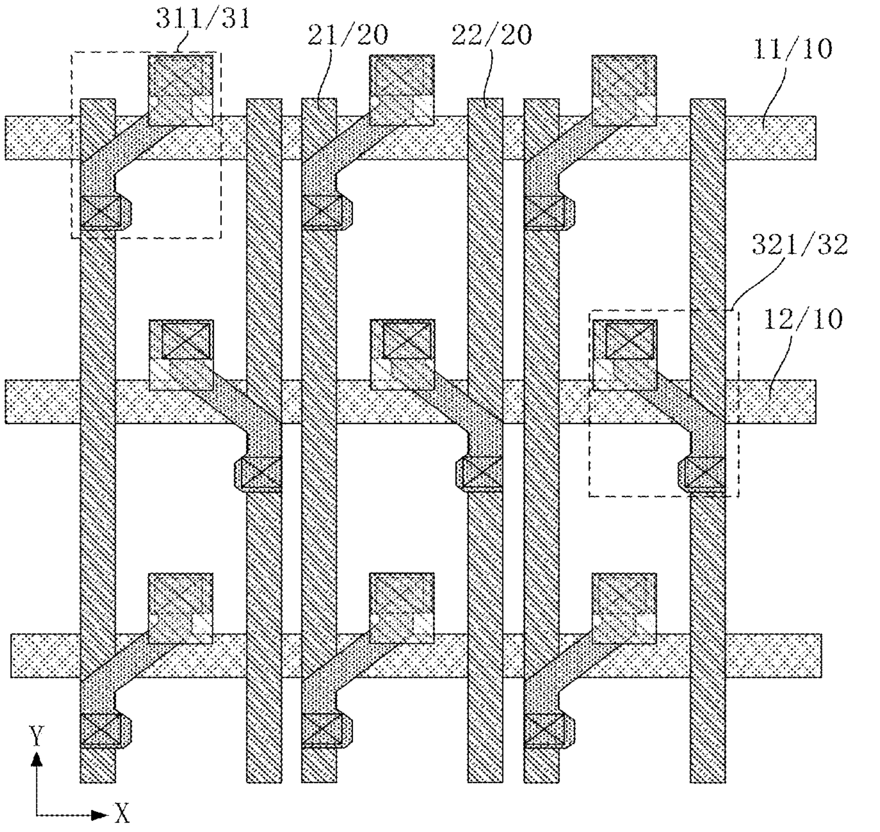
FIG. 3 is a schematic diagram of a first arrangement of sub-pixels of the display device of FIG. 1.

As shown in FIG. 3, the extension direction of the channel of the first thin film transistor 311 and the extension direction of the channel of the adjacent second thin film transistor 321 are mirrored and symmetrical in the second direction X, so that the pattern of the first thin film transistor 311 and the pattern of the second thin film transistor 321 are consistent. As such, the adjacent sub-pixels 30 are prevented from being different and the channel lengths of the thin film transistors in the sub-pixels 30 are prevented from being inconsistent due to the process fluctuation, thereby avoiding a difference in device performance, and improving the display effect.

In an embodiment of the present application, the number of the first sub-pixels 31 connected on the first data line 21 is the same as the number of the second sub-pixels 32 connected on the second data line 22. The first sub-pixel 31 is located in an odd row and the second sub-pixel 32 is located in an even row. Alternatively, the first sub-pixel 31 is located in an even row and the second sub-pixel 32 is located in an odd row.

Figure 4:
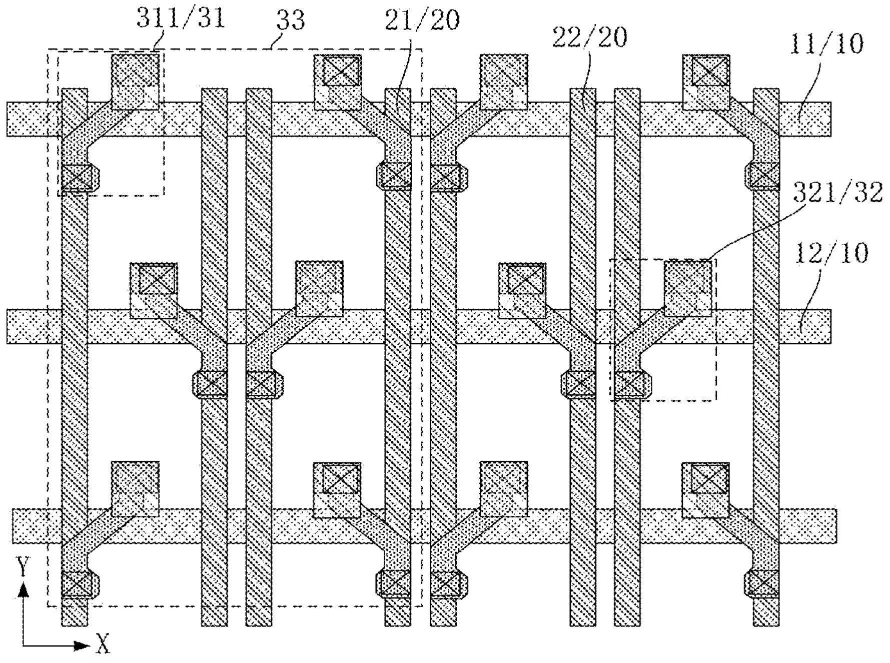
FIG. 4 is a schematic diagram of a second arrangement of sub-pixels of the display device of FIG. 1.

As shown in FIG. 4, the plurality of sub-pixels 30 includes a plurality of sub-pixel groups 33 including a first sub-pixel group 331 and a second sub-pixel group 332, each of the first sub-pixel group 331 and the second sub-pixel group 332 includes a first sub-pixel column and a second sub-pixel column. The first sub-pixel column includes a plurality of first sub-pixels 31 spaced apart in the first direction Y, and the second sub-pixel column includes a plurality of second sub-pixels 32 spaced apart in the first direction Y. The first sub-pixel group 331 and the second sub-pixel group 332 are alternately arranged in the second direction X, and the first sub-pixel group 331 and the second sub-pixel group 332 are mirror-symmetrical in the second direction X. That is, the sub-pixel group 33 includes four pixel columns, and the sub-pixel group 33 includes the first sub-pixel column, the second sub-pixel column, the second sub-pixel column, and the first sub-pixel column arranged sequentially in the second direction X.

In an embodiment of the present application, two adjacent first sub-pixels 31 are mirror-symmetrical in the second direction X, and two adjacent second sub-pixels 32 are mirror-symmetrical in the second direction X. Specifically, the extension direction of the channels of the two adjacent first thin film transistors 311 is mirror-symmetrical in the second direction X, and the extension direction of the channels of the two adjacent second thin film transistors 321 is mirror-symmetrical in the second direction X, so that the patterns of the first thin film transistors 311 and the second thin film transistors 321 are consistent, thereby avoiding that the patterns of the adjacent sub-pixels 30 are different and the channel lengths of the thin film transistors in the sub-pixels 30 are inconsistent due to the influence of the process fluctuation, thereby avoiding a difference in device performance, and improving the display effect.

In an embodiment of the present application, the number of the first sub-pixels 31 connected on the first data line 21 is the same as the number of the second sub-pixels 32 connected on the second data line 22. The sum of the number of first sub-pixels 31 connected on a first data line 21 and the number of second sub-pixels 32 connected on a second data line 22 is equal to the number of scan lines spaced along the first direction Y. The first sub-pixel 31 is located in an odd row and the second sub-pixel 32 is located in an even row. Alternatively, the first sub-pixel 31 is located in an even row and the second sub-pixel 32 is located in an odd row.

Figure 5:
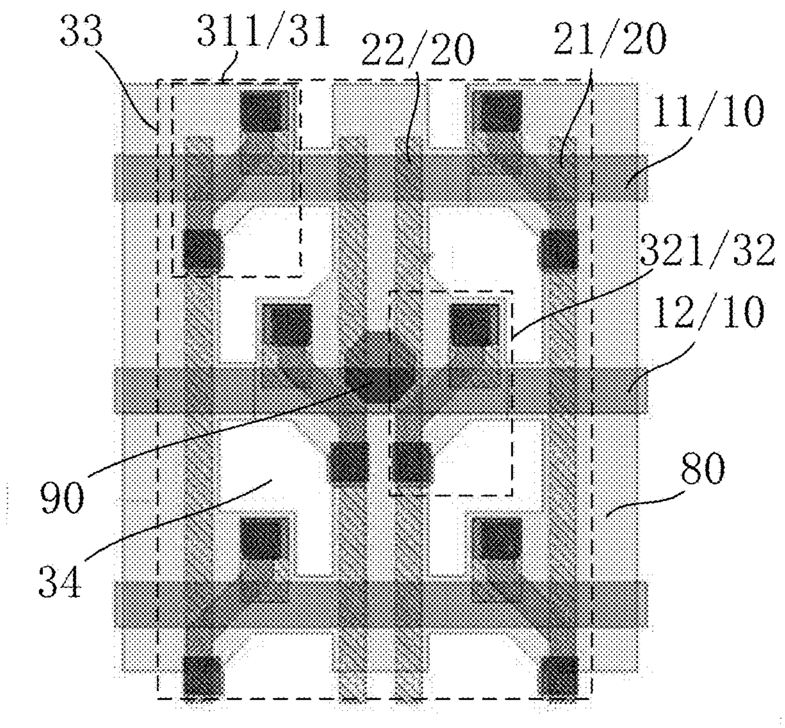
FIG. 5 is a schematic diagram of a light-shielding portion and a spacer in a display device according to an embodiment of the present application.

As shown in FIG. 5, the display device includes a plurality of light-shielding portions 80 provided in one-to-one correspondence with the sub-pixel groups 33. That is, one light-shielding section 80 is provided corresponding to a non-display area in one sub-pixel group 33. The non-display area includes a scan line 10 (first scan line 11, second scan line 12), a data line 20 (first data line 21, second data line 22), a thin film transistor, a spacer area between sub-pixels 30 (first sub-pixel 31, second sub-pixel 32), and the like.

In an embodiment of the present application, in the same sub-pixel group 33, two adjacent second sub-pixels 32 and two adjacent first sub-pixels 31 in the second direction X define a repeating unit. That is, in the same sub-pixel group 33, every four sub-pixels 30 arranged in an array define a repeating unit. Specifically, the light-shielding portion 80 may be arranged in one-to-one correspondence with the repeating unit, that is, a plurality of light-shielding sections 80 are arranged in an array.

In an embodiment of the present application, the sub-pixel 30 further includes an opening area 34. Specifically, the first sub-pixel 31 includes a first opening area 341, the second sub-pixel 32 includes a second opening area 342, two second opening areas 342 adjacent in the second direction X are mirror-symmetrical in the first direction Y, and two first opening areas 341 adjacent in the second direction X are mirror-symmetrical in the first direction Y. Specifically, the cross-section of the opening area 34 in the horizontal direction is similarly shaped as a "P" type. Accordingly, the positions of the light-shielding portion 80 corresponding to two adjacent second thin film transistors 321 in the same sub-pixel group 33 define a diamond-like shape.

In an embodiment of the present application, the display device includes a substrate 101 and a spacer 90, the orthographic projection of the light-shielding portion 80 on the substrate 101 covers the orthographic projection of the spacer 90 on the substrate 101, and the spacer 90 is provided between two second sub-pixels 32 adjacent in the second direction X. Specifically, the spacer 90 is provided between two adjacent second thin film transistors 321 in the same sub-pixel group 33 and is located in a diamond-like area of the light-shielding section 80.

In an embodiment of the present application, the orthographic projection of the spacer 90 on the substrate 101 at least partially overlaps the orthographic projection of the second scan line 12 on the substrate 101. As shown in FIG. 5, in two adjacent sub-pixel groups 33, a spacer 90 is provided between two second sub-pixels 32 adjacent in the second direction X, and the orthographic projection of the spacer 90 on the substrate 101 overlaps the orthographic projection of the second scan line 12 on the substrate 101.

In an embodiment of the present application, the spacer 90 may also be provided between two first sub-pixels 31 adjacent in the second direction X. Specifically, a plurality of spacers 90, such as two, three, four, five, six, etc., may be provided between two first sub-pixels 31 adjacent in the second direction X in two adjacent sub-pixel groups 33. The areas of the cross-sections of the plurality of spacers 90 in the first direction Y/in the second direction X may or may not be equal, that is, the sizes of the plurality of spacers 90 may or may not be the same. The spacer 90 is provided on the light-shielding portion 80, so that there is no need to provide an additional light-shielding portion for the spacer 90, and the manufacturing process can be simplified while improving the opening rate of the pixel.

In an embodiment of the present application, the spacer 90 may also be provided between two first sub-pixels 31 adjacent in the second direction X and between two second sub-pixels 32 adjacent in the second direction X.

Figure 6:
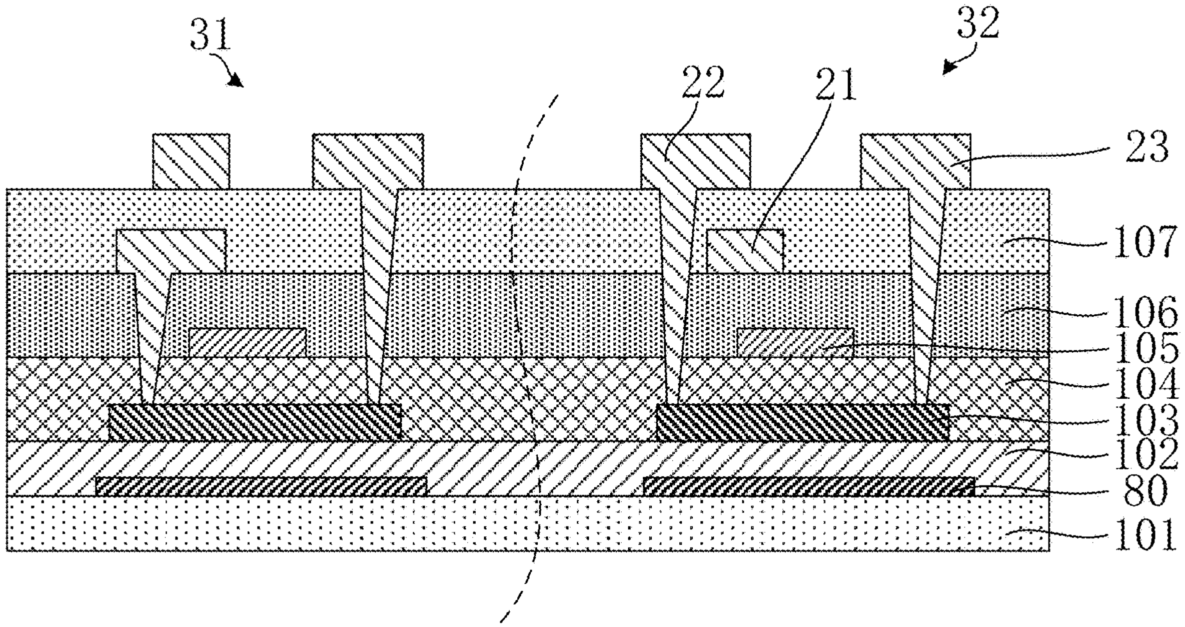
FIG. 6 is a cross-section of an arrangement of data lines of a display device according to an embodiment of the present application.

As shown in FIG. 6, the display device includes a substrate 101, the first data line 21 is provided on the substrate 101, the second data line 22 is provided on a side of the first data line 21 away from the substrate 101, and the orthographic projection of the first data line 21 on the substrate 101 at least partially overlaps the orthographic projection of the second data line 22 on the substrate 101. Preferably, the first data line 21 and the second data line 22 are alternatively arranged in the thickness direction of the substrate 101. Further, in the alternative arrangement of the first data line 21 and the second data line 22 along the thickness direction of the substrate 101, the polarity of the data signal provided on the first data line 21 is the same as the polarity of the data signal provided on the second data line 22, and their polarities may be the same as positive or negative.

Specifically, the display device further includes a light-shielding portion 80, a first insulating layer 102, an active layer 103, a second insulating layer 104, a gate layer 105, a gate insulating layer 106, a first data line 21, a third insulating layer 107, a second data line 22, and a drain electrode 23 sequentially provided on the substrate 101. The first sub-pixel 31 is connected to the first data line 21, the source electrode 21 of the first sub-pixel 31 is provided on the same layer as the first data line 21, and the drain electrode 23 is provided on the same layer as the second data line 22. The second sub-pixel 32 is connected to the second data line 22, and correspondingly, the source electrode 22 of the second sub-pixel 32 is arranged on the same layer as the second data line 22, and the drain electrode 23 is arranged on the same layer as the second data line 22, so as to reduce the spatial proportion of the data line 20 in the display area AA and to improve the opening rate of the pixel.

Figure 7:
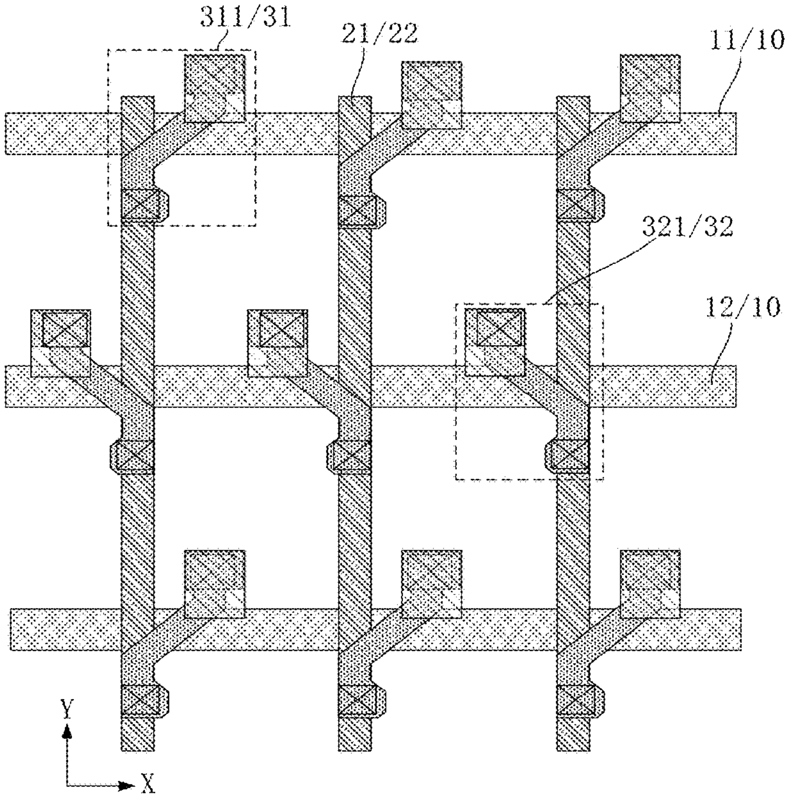
FIG. 7 is a schematic diagram of a first arrangement of sub-pixels of a display device according to an embodiment of the present application.

As shown in FIG. 7, the first sub-pixel 31 is connected to the first scan line 11, the second sub-pixel 32 is connected to the second scan line 12, the first sub-pixel 31 is connected to the first data line 21, and the first sub-pixel 31 is located on the first side of the first data line 21/the second data line 22. The second sub-pixel 32 is connected to the second data line 22, and the second sub-pixel 32 is located on the second side opposite to the first side of the first data line 21/the second data line 22. As such, the first sub-pixel 31 and the second sub-pixel 32 are alternatively connected to the first data line 21 and the second data line 22 in the first direction Y.

Figure 8:
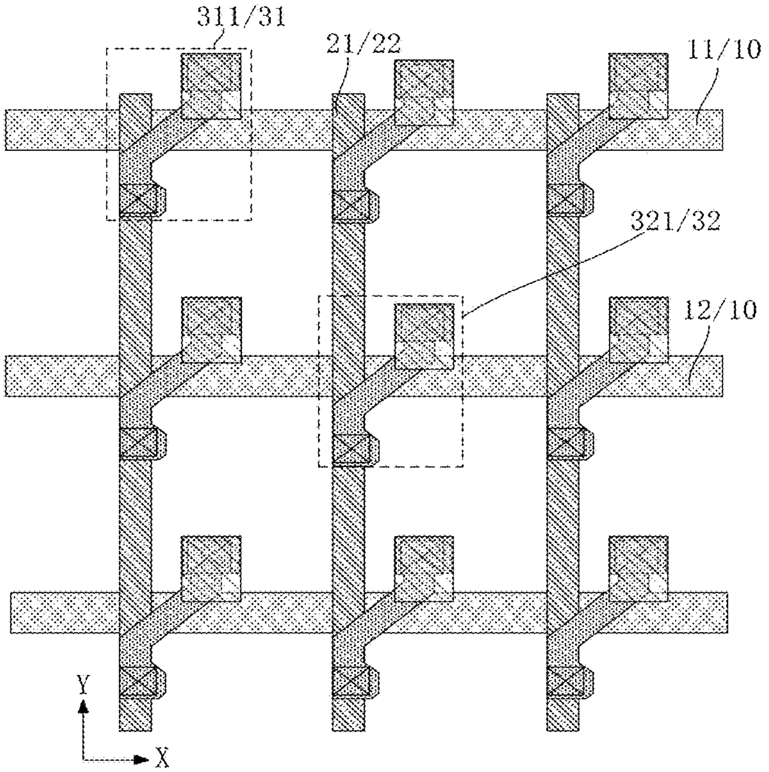
FIG. 8 is a schematic diagram of a second arrangement of sub-pixels of a display device according to an embodiment of the present application.

As shown in FIG. 8, the first sub-pixel 31 is connected to the first scan line 11, the second sub-pixel 32 is connected to the second scan line 12, the first sub-pixel 31 is connected to the first data line 21, the second sub-pixel 32 is connected to the second data line 22, and the first sub-pixel 31 and the second sub-pixel 32 are located on the same side of the first data line 21/the second data line 22. As such, the first sub-pixel 31 is connected to the first data line 21, the second sub-pixel 32 is connected to the second data line 22, and the first sub-pixel 3 and the first data line 21 are alternatively arranged with the second sub-pixel 32 and the second data line 22 in the first direction Y.

Figure 9:
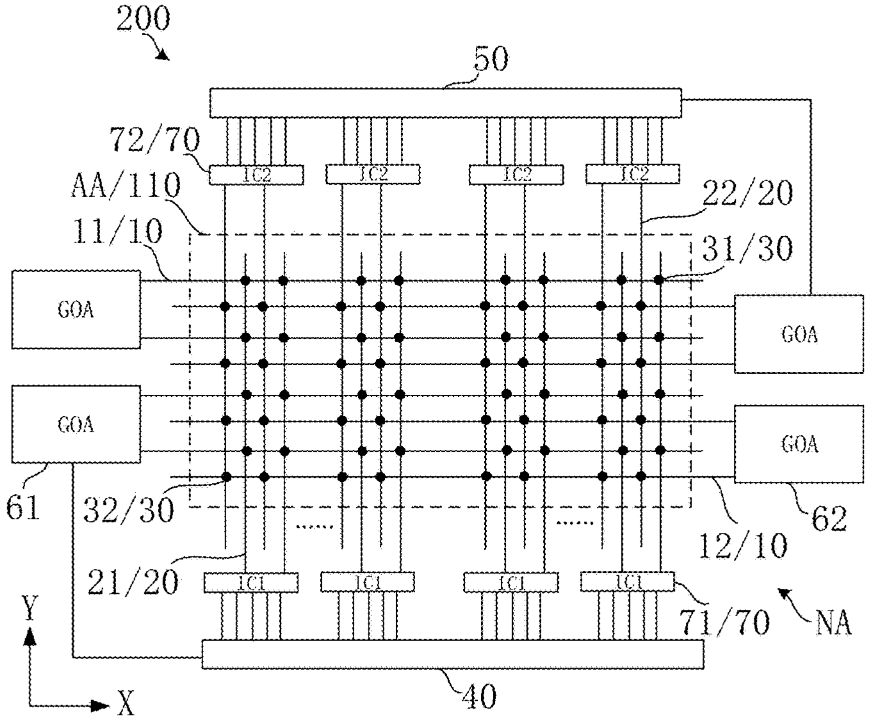
FIG. 9 is a schematic diagram of a second configuration of a display device according to an embodiment of the present application.

As shown in FIG. 9, the present application further provides a display device 200, which differs from the display device 100 in that a plurality of first source driving chips 71 in the display device 200 are respectively connected to a plurality of first data lines 21, and a plurality of second source driving chips 72 are respectively connected to a plurality of second data lines 22.

Specifically, the display device 200 includes a plurality of scan lines 10, a plurality of data lines 20, and a plurality of sub-pixels 30. The plurality of scan lines 10 includes a first scan line 11 and a second scan line 12. The first scan line 11 and the second scan line 12 are spaced apart in a first direction Y. The plurality of data lines 20 includes a first data line 21 and a second data line 22, the first data line 21 and the second data line 22 are spaced apart in a second direction X. The plurality of sub-pixels 30 includes a first sub-pixel 31 and a second sub-pixel 32, the first sub-pixel 31 is connected to the first scan line 11 and the first data line 21, and the second sub-pixel 32 is connected to the second scan line 12 and the second data line 22. The first sub-pixel 31 and the second sub-pixel 32 are alternatively arranged.

In an embodiment of the present application, the first data line 21 and the second data line 22 are alternately arranged in the second direction X, and the first scan line 11 and the second scan line 12 are alternately arranged in the first direction Y. Specifically, the first direction Y is the extension direction of the data line 20, and the second direction X is the extension direction of the scan line 10.

In an embodiment of the present application, one first sub-pixel 31 and two second sub-pixels 32 define a pixel unit, or one second sub-pixel 32 and two first sub-pixels 31 define a pixel unit. That is, each pixel unit is driven by two data lines 20 (the first data line 21 and the second data line 22).

In an embodiment of the present application, the display device 200 has a display area AA and a non-display area NA disposed around the display area AA. The display area AA is provided with sub-pixels 30, scan lines 10 and data lines 20, wherein the scan lines 10 and the data lines 20 are connected to the sub-pixels 30. The non-display area NA is provided with a first driving module 40, a second driving module 50, a multi-stage cascaded first gate driving unit 61, and a multi-stage cascaded second gate driving unit 62, and a source driving chip 70. The first driving module 40 is connected to the first gate driving unit 61, the second driving module 50 is connected to the second gate driving unit 62, and the first gate driving unit 61 and the second gate driving unit 62 are respectively located on opposite sides of the non-display area NA in the second direction X. The first gate driving unit 61 is connected to at least two scan lines 10, and the second gate driving unit 62 is connected to at least two scan lines 10. The source driving chip 70 includes a plurality of first source driving chips 71 and a plurality of second source driving chips 72. The first driving module 40 is connected to the first source driving chips 71, the second moving module is connected to the second source driving chips 72, and the source driving chip 70 is connected to the data line 20.

In an embodiment of the present application, the first gate driving unit 61 is connected to two adjacent first scan lines 11, and/or the second gate driving unit 62 is connected to two adjacent second scan lines 12. The plurality of cascaded first gate driving units 61 and the plurality of cascaded second gate driving units 62 are respectively connected to corresponding clock signal lines CK (CK1, CK2, CK3, CK4, CK5, CK6, CK7, CK8 . . . ). The first gate driving unit 61 and the second gate driving unit 62 of the same stage are connected to the same clock signal line, for example, the first gate driving unit 61 of the first stage and the second gate driving unit 62 of the first stage are connected to the CK1. Specifically, the first gate driving unit 61 may also be connected to the plurality of first scan lines 11, and the second gate driving unit 62 may also be connected to the plurality of second scan lines 12.

In an embodiment of the present application, the first driving module 40 and the second driving module 50 are located on opposite sides of the non-display area NA in the first direction Y. The first driving module 40 is provided on the side of the first source driving chip 71 away from the display area AA, and the second driving module 50 is provided on the side of the second source driving chip 72 away from the display area AA. Specifically, the plurality of first source driving chips 71 and the plurality of second source driving chips 72 are spaced apart in the second direction X.

Figure 10:
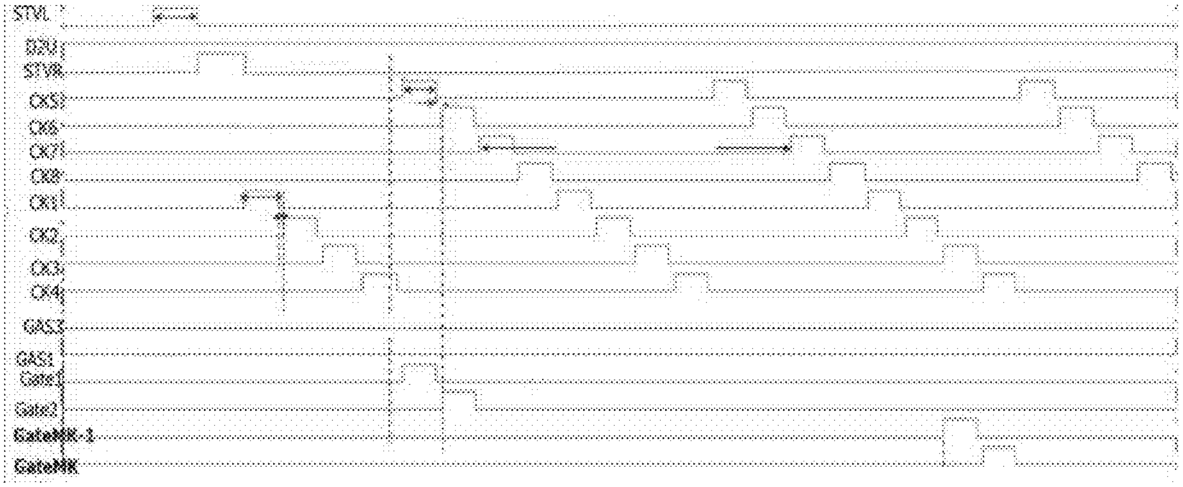
FIG. 10 is a timing chart of a pixel driving circuit of a display device according to an embodiment of the present application.

As shown in FIG. 10, the clock signal line CK (CK1, CK2, CK3, CK4, CK5, CK6, CK7, CK8 . . . ) connected in one-to-one correspondence with the multi-stage cascaded first gate driving unit 61 inputs the high-level signal sequentially to the corresponding first gate driving unit 61. The first gate driving unit 61 sequentially outputs the high-level scan signal (Gate1, Gate2 . . . GateMK) to the corresponding row of sub-pixels 30 under the control of the high-level clock signal. Accordingly, the clock signal line CK (CK1, CK2, CK3, CK4, CK5, CK6, CK7, CK8 . . . ) connected in one-to-one correspondence with the multi-stage cascaded second gate driving unit 62 inputs the high-level signal sequentially to the corresponding second gate driving unit 62. The second gate driving unit 62 sequentially outputs the high-level scan signal (Gate1, Gate2 . . . GateMK) to the corresponding row of sub-pixels 30 under the control of the high-level clock signal. The present interval time is defined between the time that the clock signal on the previous clock line of the two adjacent clock lines is changed from the high level to the low level and the time that the clock signal on the next clock line of the two adjacent clock lines is changed from the low level to the high level, so as to ensure that the clock signal on the previous clock line is switched to the low level before the clock signal on the next clock line is changed to the high level, and to avoid display abnormality caused by the mischarging phenomenon. Since the sub-pixels in the same pixel unit are respectively connected to two adjacent scan lines and two data lines, the charging time of the same pixel unit includes the scanning time of two rows of sub-pixels and the input of the data voltages at two times, corresponding to that the charging time of each pixel unit of the present application is twice the charging time of the pixel unit in the existing art.

According to the display device 200 provided in the present application, by providing the first data line 21 and the second data line 22, the first sub-pixel 31 is connected to the first data line 21, and the second sub-pixel 32 is connected to the second data line 22, so that the sub-pixels 30 of the odd columns and the sub-pixels 30 of the even columns are respectively provided with data signals by different data lines 20. That is, on the condition of reducing the load of the data line 20, the charging time of the sub-pixels 30 is increased to improve the charging condition, and the stability of signal transmission of the display device can be enhanced.

The foregoing description of the embodiments of a display device provided in the present application is merely intended to help understand the core idea of the present application, and the foregoing description should not be construed as limiting the scope of protection of the present application.

The invention claimed is:

1. A display device, comprising a display panel, wherein the display panel comprises:

a plurality of scan lines comprising a plurality of first scan lines and a plurality of second scan lines, wherein the first scan lines and the second scan lines are spaced apart in a first direction;

a plurality of data lines comprising a plurality of first data lines and a plurality of second data lines, wherein the first data lines and the second data lines are spaced apart in a second direction perpendicular to the first direction; and a plurality of sub-pixels comprising a plurality of first sub-pixels and a plurality of second sub-pixels, wherein the first sub-pixels and the second sub-pixels are alternatively arranged in the first direction, wherein each of the first sub-pixels comprises a first thin film transistor, each of the second sub-pixels comprises a second thin film transistor, the first thin film transistor is connected to one of the first scan lines and one of the first data lines, the second thin film transistor is connected to one of the second scan lines and one of the second data lines, and the first thin film transistor and the second thin film transistor are alternatively arranged; and the sub-pixels are arranged in rows and columns, and are alternately skipped along the rows and the columns.

2. The display device of claim 1, wherein an extension direction of a channel of the first thin film transistor is mirror-symmetrical in the second direction with an extension direction of a channel of the second thin film transistor adjacent to the first thin film transistor.

3. The display device of claim 2, wherein the first data lines and the second data lines are alternately arranged in the second direction, and the first scan lines and the second scan lines are alternately arranged in the first direction.

4. The display device of claim 2, wherein the sub-pixels comprises a plurality of sub-pixel groups, the sub-pixel groups comprises a plurality of first sub-pixel groups and a plurality of second sub-pixel groups, each of the first sub-pixel groups and the second sub-pixel groups comprises a first sub-pixel column and a second sub-pixel column, the first sub-pixel column comprises ones of the first sub-pixels spaced along the first direction, and the second sub-pixel column comprises ones of the second sub-pixels spaced along the first direction;

wherein the first sub-pixel groups and the second sub-pixel groups are alternately arranged in the second direction, and each of the first sub-pixel groups and one of the second sub-pixel groups adjacent to the each of the first sub-pixel groups are mirror-symmetric in the second direction.

5. The display device of claim 4, wherein the display panel comprises a plurality of light-shielding portions, and the light-shielding portions are disposed in one-to-one correspondence with the sub-pixel groups.

6. The display device of claim 5, wherein the display panel comprises a substrate and a plurality of spacers, and an orthographic projection of each of the light-shielding portions on the substrate covers an orthographic projection of one of the spacers on the substrate, and each of the spacers is disposed between two adjacent ones of the first sub-pixels in the second direction; and/or the each of the spacers is disposed between two adjacent ones of the second sub-pixels in the second direction.

7. The display device of claim 6, wherein the orthographic projection of the one of the spacers on the substrate at least partially overlaps an orthographic projection of one of the second scan lines on the substrate.

8. The display device of claim 1, wherein the display panel includes a substrate, the first data lines are disposed on the substrate, the second data lines are disposed on a side of the first data lines away from the substrate, and an orthographic projection of each of the first data lines on the substrate at least partially overlaps an orthographic projection of one of the second data lines on the substrate.

9. The display device of claim 4, wherein the display device has a display area, and a non-display area provided around the display area; the display area is provided with the sub-pixels; the non-display area is provided with a first driving module, a second driving module, a plurality of first gate driving units that are cascaded and a plurality of second gate driving units that are cascaded; the first driving module is connected to the first gate driving units; the second driving module is connected to the second gate driving units; and the first gate driving units and the second gate driving units are respectively disposed on opposite sides of the non-display area in the second direction;

wherein each of the first gate driving units is connected to at least two ones of the scan lines, and each of the second gate driving units is connected to at least two ones of the scan lines.

10. The display device of claim 9, wherein the scan lines comprise a plurality of first sub-scan lines and a plurality of second sub-scan lines, the first sub-scan lines and the second sub-scan lines are spaced apart in the second direction, the first sub-scan lines are connected to the first gate driving units, and the second sub-scan lines are connected to the second gate driving units.

11. The display device of claim 10, wherein each of the first gate driving units is connected to two adjacent ones of the first sub-scan lines, and each of the second gate driving units is connected to two adjacent ones of the second sub-scan lines.

12. The display device of claim 9, wherein the first gate driving units are connected to the first scan lines, and the second gate driving units are connected to the second scan lines.

13. The display device of claim 9, wherein each of the first gate driving units is connected to two adjacent ones of the first scan lines; and/or each of the second gate driving units is connected to two adjacent ones of the second scan lines.

14. The display device of claim 9, wherein the non-display area is further provided with a plurality of source driving chips, the source driving chips comprises a plurality of first source driving chips and a plurality of second source driving chips, the first driving module is connected to the first source driving chips, the second driving module is connected to the second source driving chips, and the source driving chips are connected to the data lines.

15. The display device of claim 14, wherein the first source driving chips, the second source driving chips, the first driving module, and the second driving module are disposed on a same side of the non-display area in the first direction.

16. The display device of claim 14, wherein the first source driving chips are connected to the first data lines, and the second source driving chips are connected to the second data lines.

17. The display device of claim 16, wherein each of the first gate driving units is connected to two adjacent ones of the first scan lines; and/or each of the second gate driving units is connected to two adjacent ones of the second scan lines.

18. The display device of claim 16, wherein the first driving module and the second driving module are disposed on opposite sides of the non-display area in the first direction.

19. The display device of claim 1, wherein each of the sub-pixels further comprises an opening area, a cross-section of the opening area has a "P" shape in a horizontal direction.

20. The display device of claim 19, wherein the first sub-pixels comprise a plurality of first opening areas respectively, the second sub-pixels comprise a plurality of second opening areas respectively, two adjacent ones of the second opening areas in the second direction are mirror-symmetrical in the second direction, and two adjacent ones of the first opening areas in the second direction are mirror-symmetrical in the second direction.

* * * * *